(12) United States Patent
Sato et al.

(10) Patent No.: US 6,482,677 B2
(45) Date of Patent: Nov. 19, 2002

(54) CHIP COMPONENT ASSEMBLY MANUFACTURING METHOD

(75) Inventors: Tomotoshi Sato, Tsuchiura (JP); Tomonori Fujii, Tsukuba (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/955,202

(22) Filed: Sep. 19, 2001

(65) Prior Publication Data

US 2002/0042161 A1 Apr. 11, 2002

(30) Foreign Application Priority Data

Sep. 25, 2000 (JP) ........................................ 2000-290267

(51) Int. Cl.[7] ..................... H01L 21/44; H01L 21/48; H01L 21/50
(52) U.S. Cl. ..................... 438/109; 438/113; 438/125; 438/126; 438/455; 438/458; 438/460
(58) Field of Search ................................ 438/109, 113, 438/125, 126, 455, 458, 460

(56) References Cited

U.S. PATENT DOCUMENTS 6,040,204 A  * 3/2000  Herden et al. ............... 438/109
6,291,259 B1 * 9/2001  Chun .......................... 438/106
6,355,501 B1 * 3/2002  Fung et al. .................. 438/107
6,235,554 B1 * 5/2002  Akram et al. ............... 438/109

* cited by examiner

*Primary Examiner*—David L. Talbott
*Assistant Examiner*—David A. Zarneke
(74) *Attorney, Agent, or Firm*—Nixon & Vanderhye, P.C.

(57) ABSTRACT

A substrate of a semiconductor wafer, an insulating substrate or the like on which a circuit is formed is cut while being supported on a sheet, and thereafter, chip components obtained by the cutting are handled while being supported on the sheet. That is, in the state in which the substrate of a semiconductor wafer, an insulating substrate or the like on which a circuit is formed is supported on the sheet, a layer of a sealing material is formed on the substrate before cutting or the chip component after cutting. Each chip component is directly picked up from the sheet by being peeled off, and the chip components are successively stacked on the sheet. This enables the easy handling of even small-size thin chip components scarcely causing the damage and warp of the chip components and enables the correct stacking of the chip components.

5 Claims, 7 Drawing Sheets

CHIP COMPONENT ASSEMBLY MANUFACTURING METHOD

BACKGROUND OF THE INVENTION

The present invention relates to a chip component assembly in which a plurality of chip components are bonded together in a stack and bump electrodes of the chip components are connected together for providing circuit continuity and to a manufacturing method therefor.

A high-density information network society will be realized in the twenty-first century, and information communications equipment for use in the society is required to have high-speed highly-improved functions including sound and image digital processing together, a small size, a light weight and a low consumption of power. The quantity of information to be handled by such information communications equipment is expected to be explosively increased. In contrast to this, the increasing speed of CPU's for executing information processing tends to be unable to be followed by only the improvement in ability of LSI's, and the importance of the mounting technologies is increasingly recognized. The mounting technologies have coped with the increase in speed of signals by technological improvement based mainly on the packaging of DIP, TSOP, BGA and so on and technological improvement with the introduction of a high-density wiring board such as a build-up board.

However, it is anticipated that the prior art technological improvement based on the presupposition of a circuit pattern formed on a surface will reach the limit of improvement in several years.

Accordingly, attention is paid to the technology of stacking chip components obtained by cutting a semiconductor wafer or an insulating substrate provided with a circuit into an LSI.

Conventionally, as the above-mentioned chip component stacking technology, it is considered to adopt the conventional stacking technology. For example, a circuit is constructed on a semiconductor wafer or an insulating substrate, and thereafter, the semiconductor wafer or the insulating substrate is cut into individual chip components by a dicing saw. Thereafter, these chip components are aligned, stacked, stuck together by means of a non-conductive film (NCF), a non-conductive paste (NCP), an anisotropic conductive film (ACF) or an anisotropic conductive paste (ACP) and sealed. At the same time, the mechanical fixation and electrical circuit continuity of the chip components are achieved.

However, the conventional technology of handling chip components as bulk components and stacking the components tends to apply friction and impact to the chip components, easily causing damage such as the cracking of chip components and easily causing the warp of chip components. Furthermore, with the reduction in size of the chip components, it is difficult to handle very small thin chip components and correctly position the components. For example, it is very difficult to transfer an encapsulation material.

SUMMARY OF THE INVENTION

In view of the aforementioned problems of the conventional chip component stacking technology, the present invention has the object of providing a chip component assembly manufacturing method capable of easily handling even small-size thin chip components, scarcely causing the damage and warp of the chip components and correctly stacking the chip components and a chip component assembly assembled by the method.

According to the present invention, in order to achieve the aforementioned object, a substrate of a semiconductor wafer, an insulating substrate or the like on which a circuit is formed is cut with the substrate supported on a sheet, and thereafter, the chip components obtained by the cutting are handled while being supported on the sheet. That is, in the state in which the substrate of a semiconductor wafer, an insulating substrate or the like on which the circuit is formed is supported on the sheet, a sealing material is given to the substrate or the chip components obtained by cutting the substrate before or after the cutting of the substrate. The chip components are directly picked up from the sheet by peeling off the components, and the chip components are successively stacked on the sheet.

In order to achieve the above object, there is provided a method for manufacturing a chip component assembly in which a plurality of chip components are stuck together in a stack and bump electrodes of the chip components are bonded together for achieving circuit continuity, comprising the steps of:

dividing on a sheet a substrate, on which the bump electrodes and a circuit are formed, into individual chip components;

forming a layer of a sealing material on a surface that includes the bump electrodes of the chip components before or after the dividing step; and picking up the divided chip components by peeling each component off the sheet and sticking the chip component onto another chip component in a stack by means of the sealing material, wherein the picking up and sticking steps are repeated to stack a desired number of chip components, thereafter the chip component located in a lowermost stratum is peeled off the sheet and the bump electrodes of upper and lower chip components are connected to each other.

According to the chip component assembly manufacturing method as described above, the chip components divided by cutting on the sheet are handled in the state in which the components are supported on the sheet. Therefore, in comparison with the case where the chip components in the bulk state are handled, the processes of aligning, conveying and so on of the chip component become unnecessary, and even thin chip components can easily be handled. Moreover, the chip components are aligned on the sheet, and therefore, the processes of aligning and conveying the chip components in the bulk state also become unnecessary. With this arrangement, neither external force nor impact is applied to the chip components, and, even in the case of thin chip components, the occurrence of cracking and warp of the components can be eliminated. Furthermore, the chip components held in specified positional relations on the sheet are handled. Therefore, the positioning becomes easy, and this allows small chip components to be positioned and stacked on one another with high accuracy.

The layer of the sealing material is preliminarily formed on the sheet and stuck to a lower surface of the substrate placed on the sealing material or is formed on an upper surface of the substrate before cutting or on an upper surface of the chip component after cutting. The sealing material is provided by, for example, a non-conductive film (NCF), a non-conductive paste (NCP), an anisotropic conductive film (ACF) or an anisotropic conductive paste (ACP).

The chip component picked up firstly from the sheet is picked up while being stuck to an interposer that concurrently serves as a base material of the chip component assembly. Conversely, it is acceptable to stack the desired number of chip components and thereafter stick the components to the interposer.

The desired number of chip components is stacked on the sheet, and thereafter, the components are subjected to regular pressure bonding on the pressure-bonding stage. It is also acceptable to stack chip components on one another while subjecting the chip components to temporary pressure bonding and finally perform the regular pressure bonding on the pressure-bonding stage.

The chip component assembly obtained by the manufacturing method described above is a chip component assembly in which a plurality of chip components are stuck together in a stack and the bump electrodes of the chip components are bonded together for achieving circuit continuity, the assembly having the plurality of chip components stacked on one another, the bump electrodes that are formed on the principal surface of these chip components and bonded to the electrodes of the other stacked chip components and the sealing material that sticks the plurality of stacked chip components together.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Embodiments of the present invention will be described in concrete and in detail below with reference to the drawings.

Figure 1:
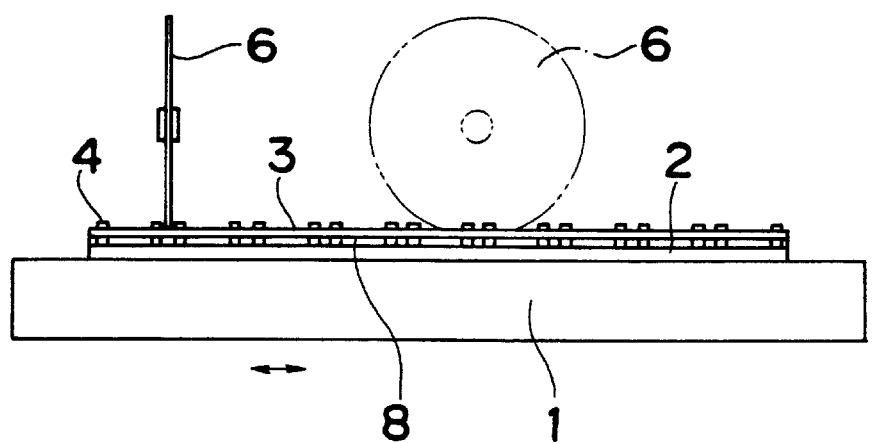
FIG. 1 is a schematic side view showing a substrate cutting process of a chip component assembly manufacturing method according to one embodiment of the present invention.
Figure 2:
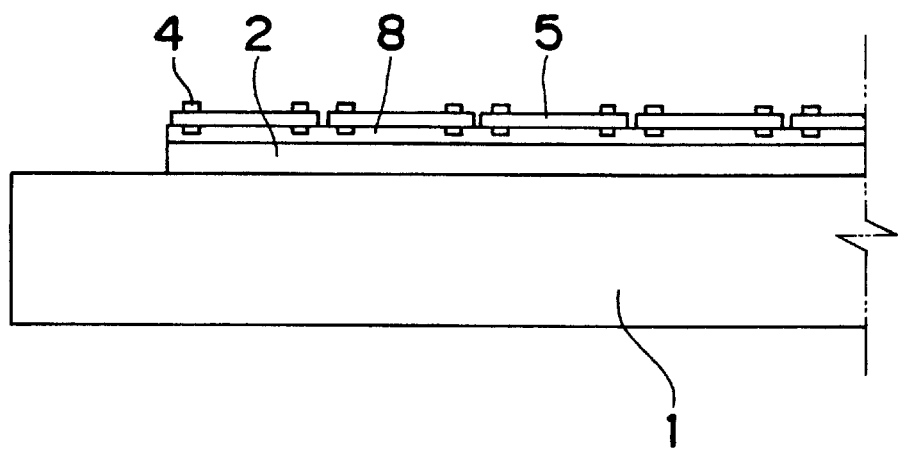
FIG. 2 is a schematic side view of an essential part showing a state obtained after the cutting of the substrate and the separation of chip components by the chip component assembly manufacturing method of the above embodiment.

FIG. 1 shows the process of placing on a flat stage 1 a substrate 3 of a semiconductor wafer or the like to which a sheet 2 is stuck via a sealing material 8 and cutting the substrate longitudinally and laterally by means of a cutter 6 of a dicing saw or the like. As shown in FIG. 2, the substrate 3 is divided into individual chip components 5.

As shown in FIG. 1, the sheet 2 is placed on the stage 1, and the substrate 3 is placed on the sheet via the sealing material 8. As the sealing material 8, there is employed, for example, a non-conductive film (NCF). This NCF is preparatorily stuck onto the sheet 2, and the substrate 3 is pressure-bonded onto the NCF. Otherwise, as the sealing material 8, there is employed a non-conductive paste (NCP). The NCP is preliminarily applied onto the sheet 2, and the substrate 3 is pressure-bonded onto the NCP.

On the substrate 3 is longitudinally and laterally arranged a plurality of circuits, and bump electrodes 4 that serve as the terminals of the circuit are formed.

As shown in FIG. 1, the substrate 3 is cut longitudinally and laterally by the cutter 6 of a dicing saw or the like along the boundaries of adjacent circuits and separated into individual chip components 5 as shown in FIG. 2. In this state, the chip components 5 are supported on the sheet 2 via the sealing material 8, and the chip components 5 remain supported on the substrate 3 in terms of positional relations.

Figure 3:
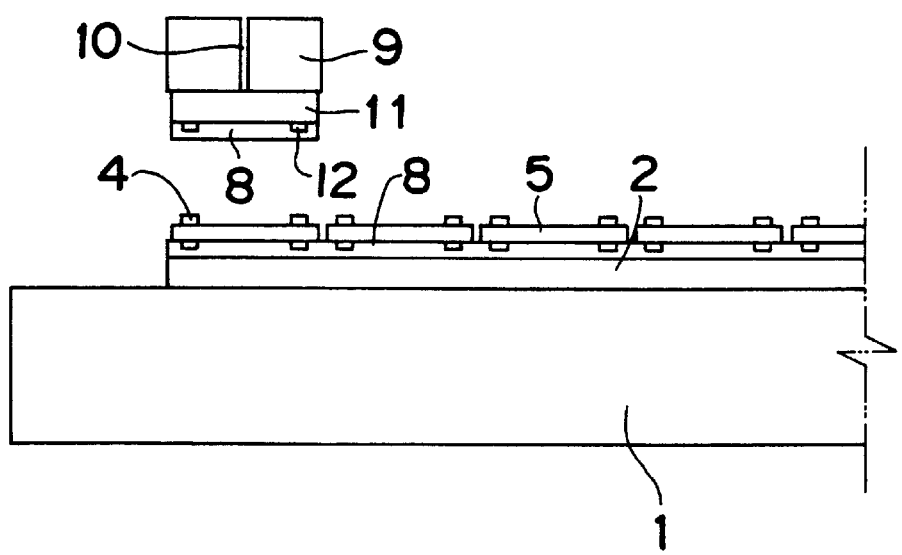
FIG. 3 is a schematic side view of an essential part showing a process of stacking a first chip component on an interposer by the chip component assembly manufacturing method of the above embodiment.

As shown in FIG. 3, a chucking head 9, to the lower surface of which an interposer 11 that serves as a base material of a chip component assembly is attached, is arranged on one chip component 5. This chucking head 9 sucks by vacuum the interposer 11 to its lower surface that has a negative pressure by means of, for example, a suction hole 10 and holds the interposer.

The interposer 11 is also provided with a circuit, and the lower surface of the interposer is provided with bump electrodes 12 in correspondence with the bump electrodes 4 of the chip component 5. The sealing material 8 is preliminarily applied to the lower surface of the interposer 11 provided with the bump electrodes 12. This sealing material 8 is provided by an NCF as described above and preparatorily stuck to the lower surface of the interposer 11.

Figure 4:
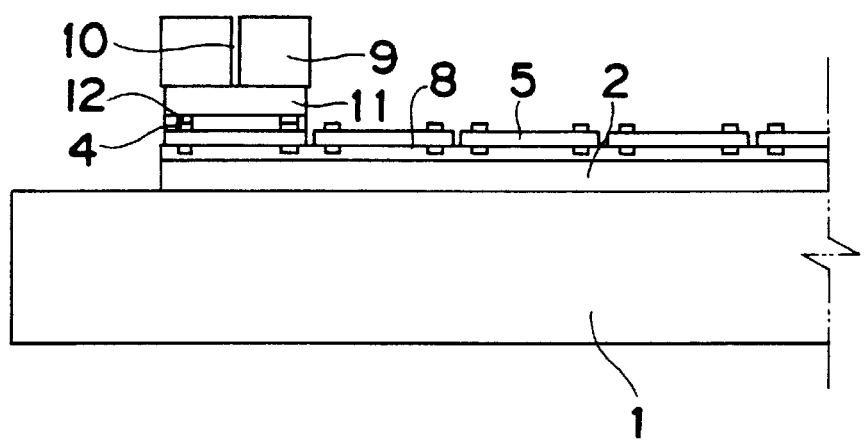
FIG. 4 is a schematic side view of the essential part showing the process of stacking the first chip component on the interposer by the chip component assembly manufacturing method the above embodiment.

The chucking head 9 moves down as shown in FIG. 4 from the position shown in FIG. 3 and pressurizes the interposer 11 located on the lower surface against the upper surface of the chip component 5. By this operation, the chip component 5 is stuck to the lower surface of the interposer 11 via the sealing material 8 applied to the interposer 11.

Figure 5:
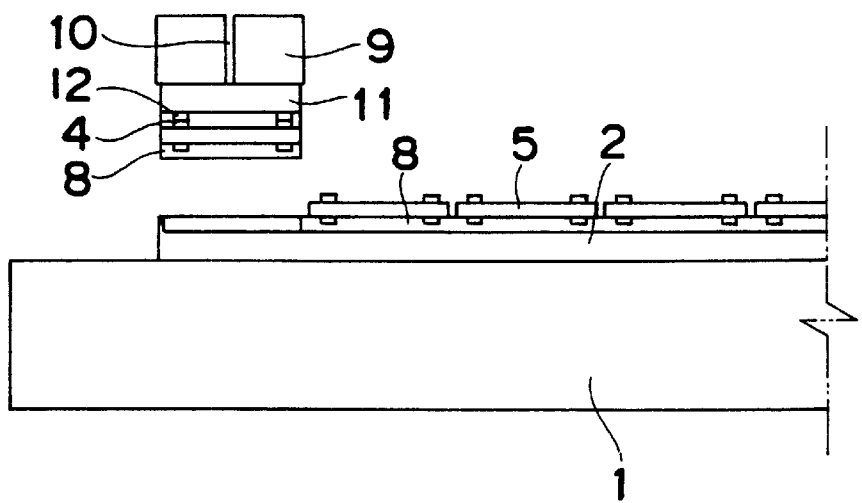
FIG. 5 is a schematic side view of the essential part showing the process of stacking the first chip component on the interposer by the chip component assembly manufacturing method the above embodiment.
Figure 6:
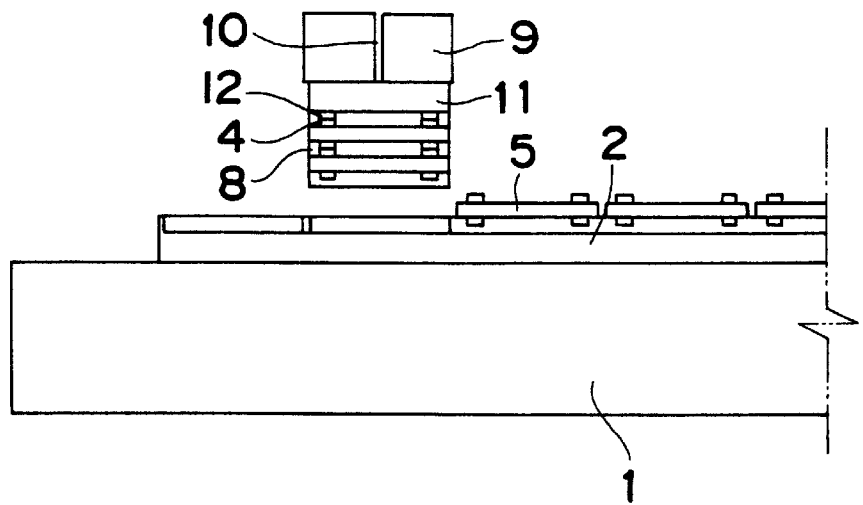
FIG. 6 is a schematic side view of an essential part showing a process of stacking the next chip component on the first chip component by the chip component assembly manufacturing method of the above embodiment.

Next, the chucking head 9 moves up as shown in FIG. 5 from the position shown in FIG. 4. At this time, the chip component 5 is picked up while being stuck to the lower surface of the interposer 11, and a state in which the layer of the sealing material 8 is partially cut away to the lower surface of the chip component 5 and attached to the lower surface of the chip component 5 is maintained. Subsequently, the chucking head 9 moves to a position just above the chip component 5 to be stacked next.

Subsequently, the chucking head 9 moves up and down similarly to the aforementioned manner to stack the next chip component 5 under the chip component 5 stuck to the lower surface of the interposer 11 and stick the chip component by means of the sealing material 8. This operation will be repeated to stack the necessary chip components 5 and stick the chip components via the sealing material 8.

Figure 7:
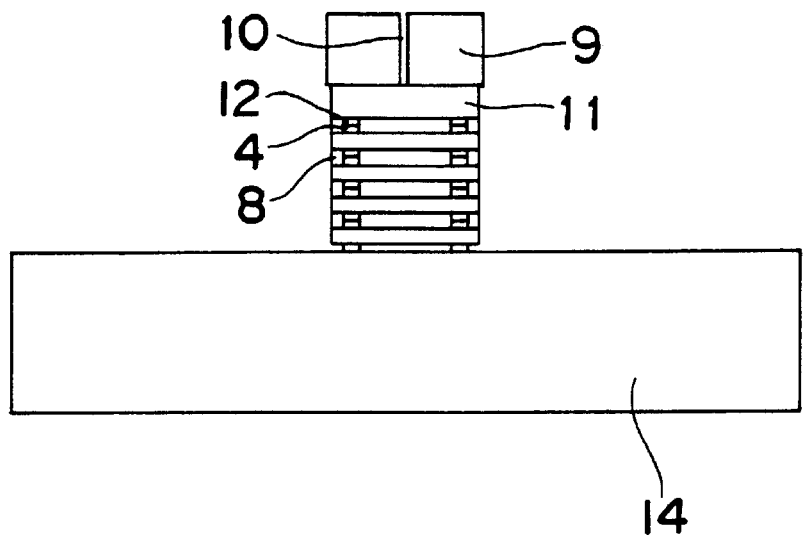
FIG. 7 is a schematic side view of an essential part showing a process of pressure bonding an interposer to the chip component by the chip component assembly manufacturing method of the above embodiment.

After stacking the necessary chip components 5, the chucking head 9 moves to the pressure-bonding stage 14 while holding the stack of the chip components 5 as shown in FIG. 7 and places the stack of chip components 5 on the pressure-bonding stage 14. On this pressure-bonding stage 14, the stack of chip components 5 and the interposer 11 are pressurized at a heating temperature of about 180° C. for about 20 seconds so as to pressure-bond them together. A pressure at the time of the pressure bonding is about 80 g per bump electrode 4 of 100-μm square.

Figure 8A:
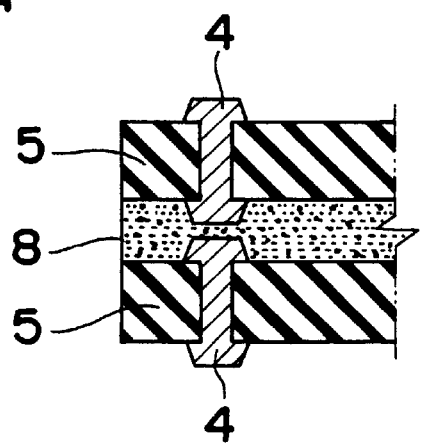
FIGS. 8A and 8B are schematic enlarged longitudinal sectional view of an essential part showing a state before pressure bonding and a state after the pressure bonding of two chip components obtained by the chip component assembly manufacturing method of the above embodiment.
Figure 8B:
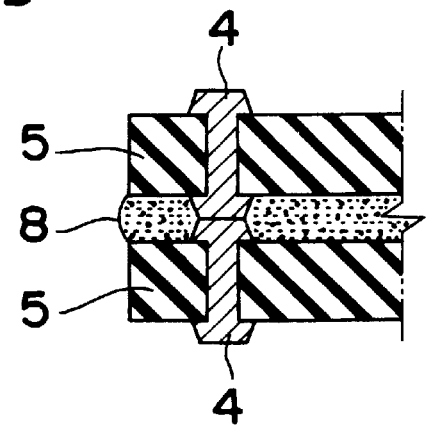

By this pressure bonding, a portion between the chip components 5 shifts from a state as shown in, for example, FIG. 8A into a state as shown in FIG. 8B, in which the bump electrodes 4 are brought in contact with each other and the NCF of the sealing material 8 is hardened. Through this process, the bump electrodes 4 and 12 of the upper and lower chip components 5 and the interposer 11 become mutually conductive, and the sealing between the upper and lower chip components 5 and the interposer 11 is completed. Through these processes, a chip component assembly is completed.

The chip component assembly completed through the aforementioned processes is basically constructed so that the plurality of chip components 5 are bonded together in a stack and the bump electrodes 4 of those chip components 5 are connected together for achieving circuit continuity.

FIGS. 9 through 14 show a chip component assembly manufacturing method according to another embodiment of the present invention. As shown in FIG. 1, according to this embodiment, similarly to the aforementioned embodiment, a substrate 3 is longitudinally and laterally cut on a stage 1 while being supported on the sheet 2 and divided into individual chip components 5.

Figure 9:
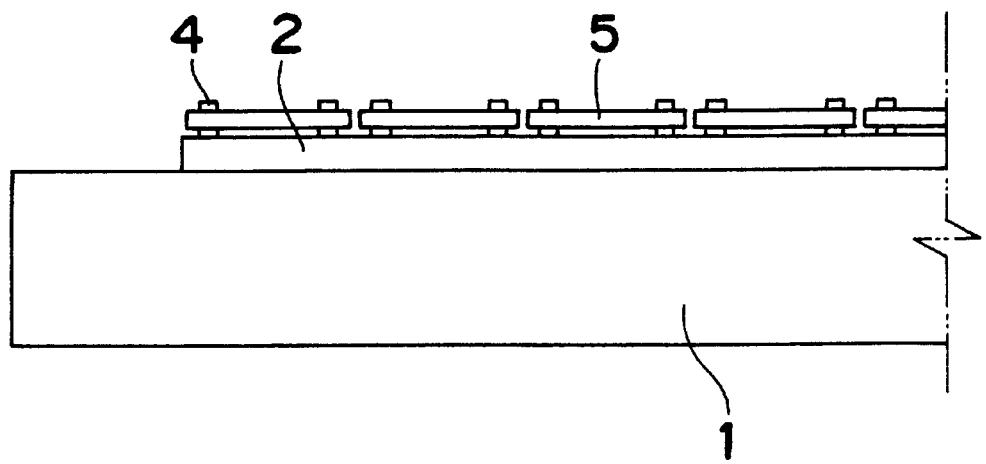
FIG. 9 is a schematic side view of an essential part showing a state obtained after the cutting of the substrate and the separation of chip components by a chip component assembly manufacturing method according to another embodiment of the present invention.
Figure 10:
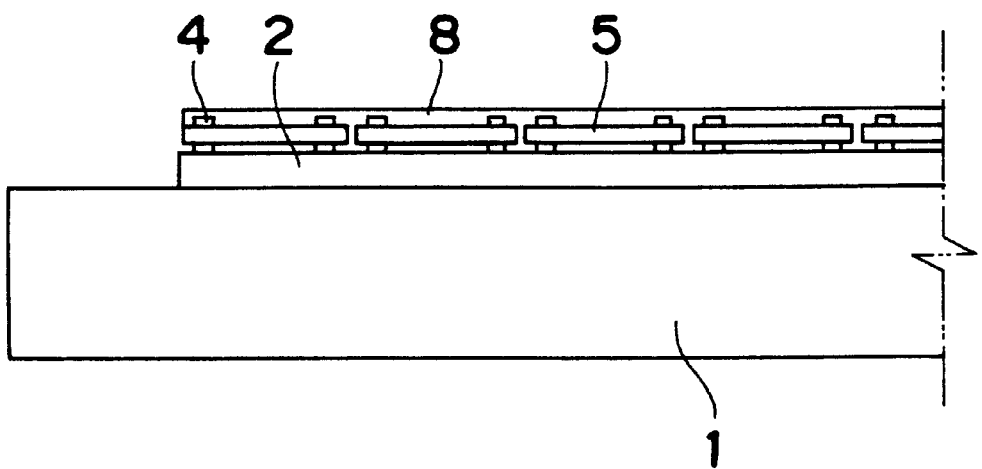
FIG. 10 is a schematic side view of an essential part showing a state obtained after the coating of a sealing material on chip components by the chip component assembly manufacturing method of the above embodiment.

In this embodiment, a sealing material 8 made of NCP is applied onto the substrate 3 or the chip components 5 before or after the cutting process. In FIGS. 9 and 10, first of all, as shown in FIG. 9, the substrate 3 is longitudinally and laterally cut on the stage 1 while being supported on the sheet 2 and divided into individual chip components 5. Thereafter, as shown in FIG. 10, the sealing material 8 is applied onto the separated chip components 5. Conversely, it is also acceptable to apply the sealing material 8 onto the substrate 3 before the cutting and thereafter separate the substrate 3 into individual chip components 5 by the cutting. The sealing material 8 is applied by means of, for example, a roller or a dispenser or by means of screen printing or the like.

Subsequently, the chip components 5 are stacked by the chucking head 9 similarly to the aforementioned processes.

Figure 11:
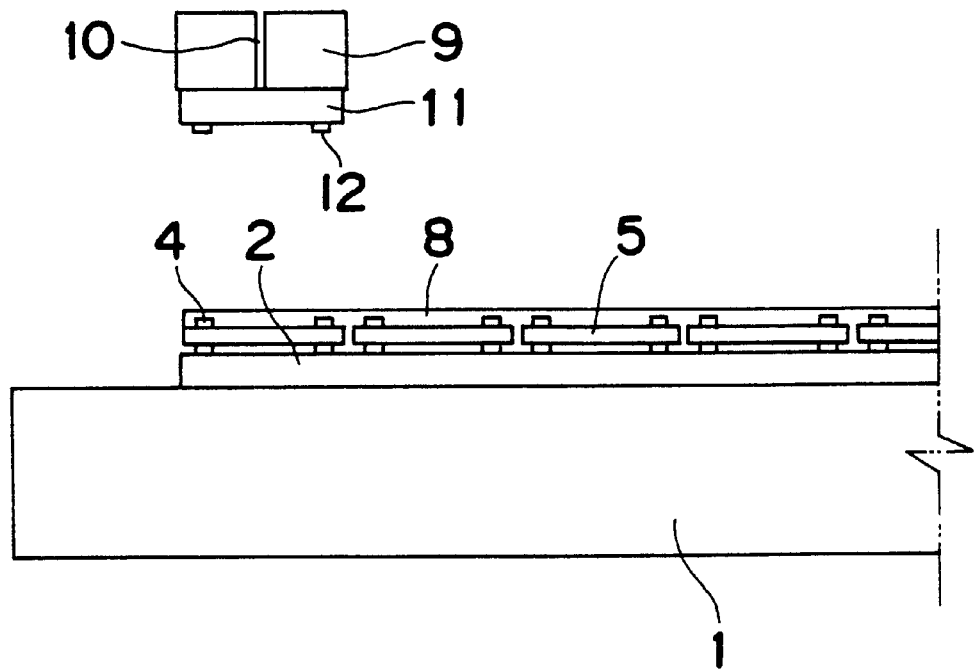
FIG. 11 is a schematic side view of an essential part showing a process of stacking a first chip component on an interposer by the chip component assembly manufacturing method of the above embodiment.

That is, as shown in FIG. 11, the chucking head 9, to the lower surface of which an interposer 11 that serves as a base material of the chip component assembly is attached, is arranged on one chip component 5. The present embodiment differs from the aforementioned embodiment in that no sealing material is applied to the lower surface of the interposer 11.

Figure 12:
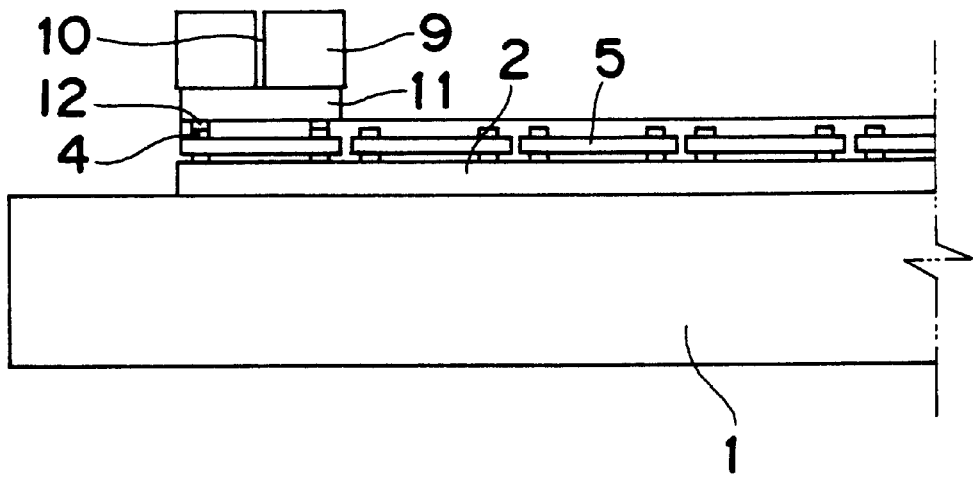
FIG. 12 is a schematic side view of the essential part showing the process of stacking the first chip component on the interposer by the chip component assembly manufacturing method of the above embodiment.

The chucking head 9 moves down as shown in FIG. 12 from the position shown in FIG. 11 and pressurizes the interposer 11 located on the lower surface thereof against the upper surface of the chip component 5. By this operation, the chip component 5 is stuck to the lower surface of the interposer 11 via the sealing material 8 applied to the chip component 5.

Figure 13:
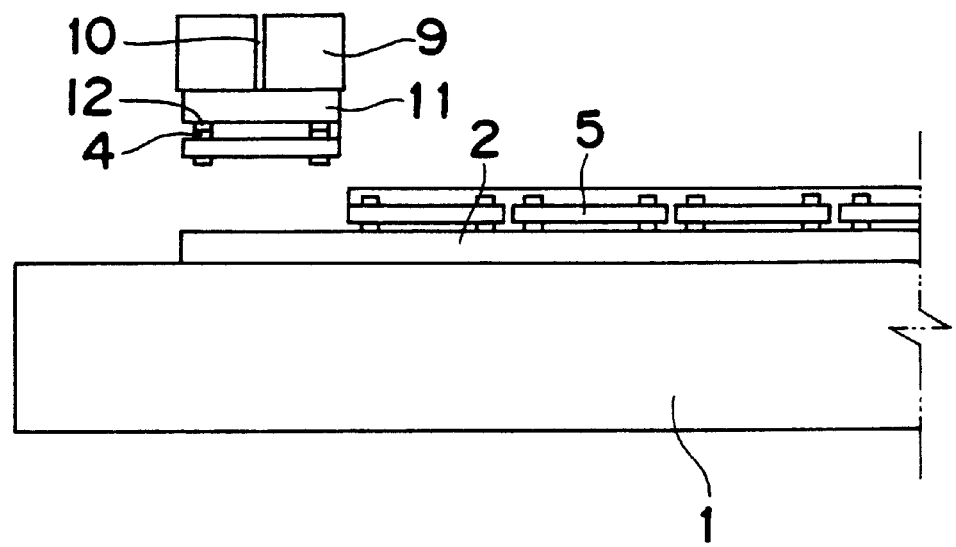
FIG. 13 is a schematic side view of the essential part showing the process of stacking the first chip component on the interposer by the chip component assembly manufacturing method of the above embodiment.
Figure 14:
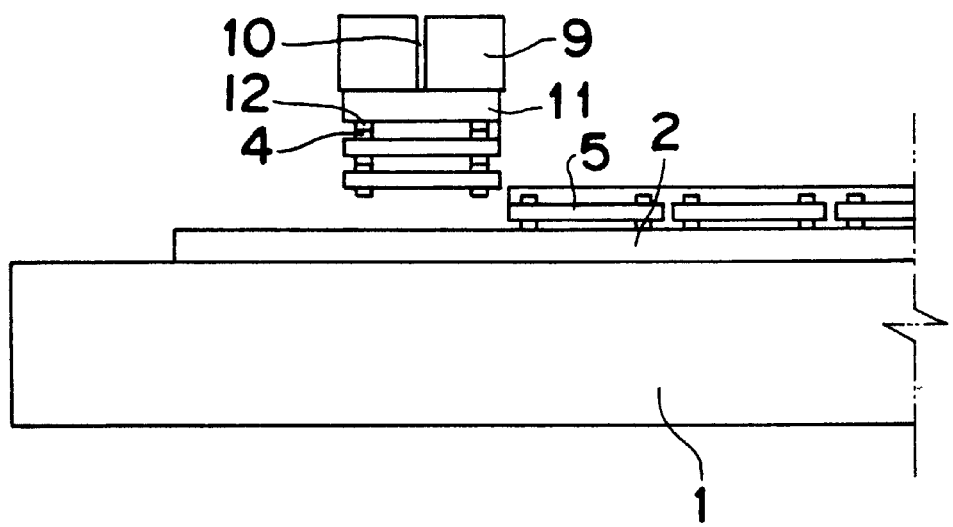
FIG. 14 is a schematic side view of an essential part showing a process of stacking the next chip component on the first chip component by the chip component assembly manufacturing method of the above embodiment of the present invention.

Next, the chucking head 9 moves up as shown in FIG. 13 from the position shown in FIG. 12. At this time, the chip component 5 is picked up while being stuck to the lower surface of the interposer 11. Subsequently, the chucking head 9 moves to a position just above the chip component 5 to be stacked next.

Subsequently, the chucking head 9 moves up and down similarly to the aforementioned manner to stack the next chip component 5 under the chip component 5 stuck to the lower surface of the interposer 11 and stick together and seal the chip components by means of the sealing material 8. By subsequently repeating this operation, the required number of chip components 5 is stacked on one another, and the chip components are stuck together via the sealing material 8.

After stacking the necessary chip components 5, similarly to the foregoing description with reference to FIG. 7, the chucking head 9 moves to the pressure-bonding stage 14 while holding the stack of chip components 5, places the stack of chip components 5 on this pressure-bonding stage 14 and applies heat and pressure to perform pressure bonding. Through these processes, a chip component assembly is completed.

Figure 15:
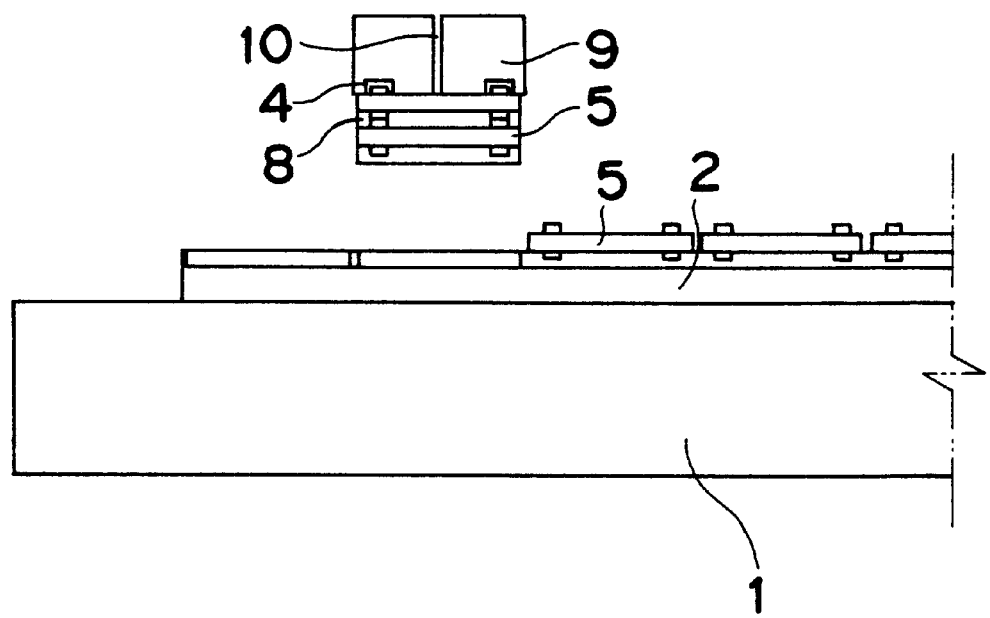
FIG. 15 is a schematic side view of an essential part showing a process of stacking chip components by a chip component assembly manufacturing method according to another embodiment of the present invention.
Figure 16:
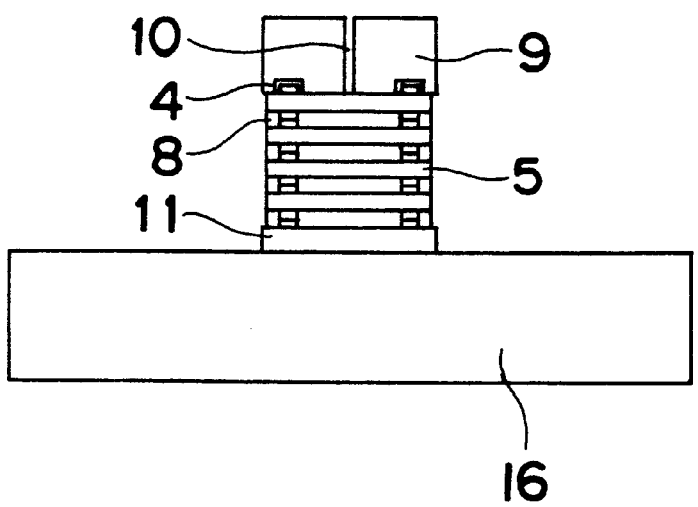
FIG. 16 is a schematic side view of an essential part showing a process of pressure bonding a chip component to an interposer by the chip component assembly manufacturing method of the above embodiment.

FIGS. 15 and 16 show a chip component assembly manufacturing method according to another embodiment of the present invention. According to the chip component assembly manufacturing method of the present embodiment, basically similar to the aforementioned embodiment, the chip components 5 are stuck together by means of the sealing material 8 on the sheet 2 as in the foregoing embodiment.

It is to be noted that this embodiment directly sucks and holds the first chip component 5 by means of the chucking head 9, differently from the sticking of chip components 5 to the interposer 11 preparatorily held on the lower surface of the chucking head 9, and thereafter stacks the chip components 5 similarly to the aforementioned manner.

Then, after stacking the necessary chip components 5, the chucking head 9 moves to a temporary pressure-bonding stage 16 while holding the stack of chip components 5 and places the stack of chip components 5 on the interposer 11 placed on this temporary pressure-bonding stage 16, as shown in FIG. 16. Then, pressurization, heating and temporary pressure bonding are performed on this temporary pressure-bonding stage 16. Subsequently, the stack of chip components 5 on the interposer 11 is moved by the chucking head 9 to the pressure-bonding stage for performing the regular pressure bonding, and the regular pressure bonding is performed similarly to the aforementioned description provided with reference to FIG. 7.

Although the non-conductive film (NCF) or the non-conductive paste (NCP) is employed as the sealing material 8 in the aforementioned embodiments, it is, of course, acceptable to employ an anisotropic conductive film (ACF) or an anisotropic conductive paste (ACP) as the sealing material 8 in place of each of them.

As described above, according to the chip component assembly and the manufacturing method therefor of the present invention, small-size thin chip components 5 can easily be positioned and stacked together with high accuracy without applying an external force nor impact to the chip components 5. This enables the easy handling of even small-size thin chip components and the correct stacking of the chip components, scarcely causing the damage or warp of the chip components.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a chip component assembly in which a plurality of chip components are stuck together in a stack and bump electrodes of the chip components are bonded together for achieving circuit continuity, comprising the steps of:

dividing on a sheet a substrate, on which the bump electrodes and a circuit are formed, into individual chip components;

forming a layer of a sealing material on a surface that includes the bump electrodes of the chip components before or after the dividing step; and picking up the divided chip components by peeling each component off the sheet and sticking the chip component onto another chip component in a stack by means of the sealing material, wherein the picking up and sticking steps are repeated to stack a desired number of chip components, thereafter the chip component located in a lowermost stratum is peeled off the sheet and the bump electrodes of upper and lower chip components are connected to each other.

2. A chip component assembly manufacturing method as claimed in claim 1, wherein the layer of the sealing material is preliminarily formed on the sheet and stuck to a lower surface of the substrate placed on the sealing material.

3. A chip component assembly manufacturing method as claimed in claim 1, wherein the layer of the sealing material is formed on an upper surface of the substrate before cutting or on an upper surface of the chip component after cutting.

4. A chip component assembly manufacturing method as claimed in claim 1, wherein the chip component picked up firstly from the sheet is picked up while being stuck to an interposer that concurrently serves as a base material of the chip component assembly.

5. A chip component assembly manufacturing method as claimed in claim 1, wherein temporary pressure bonding is performed in stacking the chip components on the sheet, and regular pressure bonding is performed on a pressure-bonding stage after stacking the chip components.

* * * * *